(12) United States Patent
Gruber et al.

(10) Patent No.: US 8,866,274 B2
(45) Date of Patent: Oct. 21, 2014

(54) SEMICONDUCTOR PACKAGES AND METHODS OF FORMATION THEREOF

(75) Inventors: Hermann Gruber, Woerth a.D. (DE);
Joachim Mahler, Regensburg (DE);
Uwe Hoeckele, Regensburg (DE);
Anton Prueckl, Schierling (DE);
Thomas Fischer, Regensburg (DE);
Matthias Schmidt, Munich (DE)

(73) Assignee: Infineon Technologies AG, Neubiberg (DE)

( * ) Notice: Subject to any disclaimer, the term of this patent is extended or adjusted under 35 U.S.C. 154(b) by 168 days.

(21) Appl. No.: 13/431,251

(22) Filed: Mar. 27, 2012

(65) Prior Publication Data

US 2013/0256857 A1  Oct. 3, 2013

(51) Int. Cl.
*H01L 23/495* (2006.01)
*H01L 21/00* (2006.01)
*H01L 23/31* (2006.01)

(52) U.S. Cl.
CPC ................. *H01L 23/3114* (2013.01);
*H01L 23/3185* (2013.01)
USPC ........... 257/672; 257/676; 257/701; 257/724; 257/783; 257/784; 438/118; 438/126

(58) Field of Classification Search
CPC ............ H01L 23/3135; H01L 23/3107; H01L 23/3157; H01L 23/3171; H01L 23/3192; H01L 23/59562; H01L 23/49575; H01L 23/3114; H01L 23/3185; H01L 24/83
USPC ................. 257/672, 676, 790, 701, 723, 724, 257/782–784, 787; 438/118, 125–127
See application file for complete search history.

(56) References Cited

U.S. PATENT DOCUMENTS

| | | | |
|---|---|---|---|
| 5,536,970 A * | 7/1996 | Higashi et al. | 257/676 |
| 5,959,363 A * | 9/1999 | Yamada et al. | 257/787 |
| 5,965,933 A | 10/1999 | Young et al. | |
| 5,982,625 A | 11/1999 | Chen et al. | |
| 6,114,191 A | 9/2000 | Young et al. | |
| 6,300,143 B1 | 10/2001 | Chinn et al. | |
| 6,404,065 B1 | 6/2002 | Choi | |
| 6,534,343 B2 | 3/2003 | Choi | |
| 6,768,196 B2 | 7/2004 | Harney et al. | |
| 6,781,219 B2 * | 8/2004 | Bissey | 257/666 |
| 6,924,171 B2 * | 8/2005 | Buchwalter et al. | 438/106 |
| 6,979,909 B2 | 12/2005 | Shinohara | |
| 7,667,326 B2 | 2/2010 | Hoeglauer et al. | |
| 7,683,482 B2 * | 3/2010 | Nishida et al. | 257/737 |
| 7,829,386 B2 | 11/2010 | Fillion et al. | |
| 7,982,309 B2 | 7/2011 | Vervoort et al. | |
| 8,129,759 B2 | 3/2012 | Othieno et al. | |
| 8,138,593 B2 * | 3/2012 | Pagkaliwangan et al. | 257/685 |
| 8,330,252 B2 | 12/2012 | Mahler et al. | |
| 8,488,316 B2 | 7/2013 | Zeng et al. | |

(Continued)

FOREIGN PATENT DOCUMENTS

DE   102006049949 B3   5/2008

*Primary Examiner* — Alonzo Chambliss
(74) *Attorney, Agent, or Firm* — Slater & Matsil, L.L.P.

(57) ABSTRACT

In one embodiment, a method of forming a semiconductor package comprises providing a first die having contact regions on a top surface but not on an opposite bottom surface. A dielectric liner layer is deposited under the bottom surface of the first die. The first die is attached with the deposited dielectric liner layer to a die paddle of a substrate. A bond layer is disposed between the substrate and the dielectric liner layer.

46 Claims, 9 Drawing Sheets

(56) References Cited

U.S. PATENT DOCUMENTS

| | | |
|---|---|---|
| 8,519,532 B2 | 8/2013 | Lenniger et al. |
| 8,604,615 B2 * | 12/2013 | Lee et al. .................. 257/737 |
| 2003/0057541 A1 * | 3/2003 | Betori ........................ 257/690 |
| 2007/0216011 A1 | 9/2007 | Otremba et al. |
| 2008/0246137 A1 | 10/2008 | Mahler et al. |
| 2008/0296782 A1 * | 12/2008 | Otremba et al. ............ 257/783 |
| 2009/0102034 A1 * | 4/2009 | Pagkaliwangan et al. .... 257/676 |
| 2010/0007007 A1 * | 1/2010 | Yoon et al. ................. 257/692 |
| 2010/0078832 A1 | 4/2010 | Theuss |
| 2010/0140669 A1 | 6/2010 | Xie |
| 2010/0193920 A1 | 8/2010 | Poh et al. |
| 2010/0213587 A1 * | 8/2010 | Bemmerl et al. ............ 257/670 |
| 2010/0297810 A1 | 11/2010 | Otremba et al. |
| 2011/0234215 A1 | 9/2011 | Ausserlechner |
| 2011/0260305 A1 | 10/2011 | Saboco |
| 2011/0298115 A1 | 12/2011 | Celaya et al. |
| 2012/0049222 A1 * | 3/2012 | Yoshizumi et al. ............ 257/98 |
| 2012/0327614 A1 * | 12/2012 | Mahler et al. ................ 361/752 |
| 2013/0049137 A1 | 2/2013 | Uno et al. |

* cited by examiner

SEMICONDUCTOR PACKAGES AND METHODS OF FORMATION THEREOF

TECHNICAL FIELD

The present invention relates generally to semiconductor devices, and more particularly to semiconductor packages and methods of formation thereof.

BACKGROUND

Semiconductor devices are used in many electronic and other applications. Semiconductor devices comprise integrated circuits that are formed on semiconductor wafers by depositing many types of thin films of material over the semiconductor wafers, and patterning the thin films of material to form the integrated circuits.

The semiconductor devices are typically packaged within a ceramic or a plastic body to protect from physical damage and corrosion. The packaging also supports the electrical contacts required to connect to the devices. Many different types of packaging are available depending on the type and the intended use of the die being packaged. Typical packaging, e.g., dimensions of the package, pin count, may comply with open standards such as from Joint Electron Devices Engineering Council (JEDEC). Packaging may also be referred as semiconductor device assembly or simply assembly.

In many applications, multiple semiconductor devices or dies are packages within a single semiconductor package. The various dies within the package typically interact through the provided interconnects. However, as the dies are closely packaged or brought closer together due to reduction in package size or other reasons, other parasitic mechanisms may begin to operate and deteriorate the performance of the semiconductor device.

SUMMARY OF THE INVENTION

These and other problems are generally solved or circumvented, and technical advantages are generally achieved, by illustrative embodiments of the present invention.

In accordance with an embodiment of the invention, a semiconductor package comprises a first die embedded within an encapsulant and disposed over a substrate. A dielectric liner layer is disposed under the first die and between the first die and the substrate. The dielectric liner layer completely covers a bottom surface of the first die. A bond layer disposed between the substrate and the dielectric liner layer.

In accordance with an embodiment of the invention, a semiconductor package comprises a first die embedded within an encapsulant and disposed over a substrate. A dielectric liner layer is disposed at the first die and between the first die and the substrate. The dielectric liner layer is disposed around sidewalls of the first die.

In accordance with an embodiment of the present invention, a semiconductor package comprises a lead frame comprising a die paddle and a plurality of leads, and a first die embedded within an encapsulant and disposed over the die paddle. A second die is embedded within the encapsulant and disposed over the die paddle. The second die is electrically coupled to the die paddle. A dielectric liner layer is disposed under the first die and the die paddle. The first die is electrically isolated from the die paddle. The dielectric liner layer comprises a thickness of about 100 nm to about 10 µm.

In accordance with an embodiment of the present invention, a method of fabricating a semiconductor package comprises providing a first die having contact regions on a top surface but not on an opposite bottom surface. A dielectric liner layer is deposited under the bottom surface of the first die. The first die is attached with the deposited dielectric liner layer to a die paddle of a lead frame.

In accordance with an embodiment of the present invention, a method of fabricating a semiconductor package comprises providing a first substrate with a plurality of first dies and singulating the first substrate into the plurality of first dies. The plurality of first dies has contact regions on a top surface. A dielectric liner layer is deposited under a bottom surface of a first die of the plurality of first dies after singulating. The bottom surface has no contact regions. The first die is attached with the deposited dielectric liner layer to a die paddle of a lead frame.

The foregoing has outlined rather broadly the features of an embodiment of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which:

FIG. 1, which includes FIGS. 1A and 1B, illustrates a semiconductor package in accordance with an embodiment of the invention, wherein FIG. 1A illustrates a cross-sectional view and FIG. 1B illustrates a top view;

FIG. 2, which includes FIGS. 2A and 2B, illustrates an alternative embodiment of a semiconductor package wherein the isolating dielectric layer is formed on the sidewalls of the first die, wherein FIG. 2A illustrates a cross-sectional view and FIG. 2B illustrates a top view;

FIG. 3, which includes FIGS. 3A and 3B, illustrates a semiconductor package having a plurality of dies mounted over a die paddle but at least one of the die is not connected to the die paddle, wherein FIG. 3A illustrates a cross-sectional view and FIG. 3B illustrates a top view;

FIG. 4, which includes FIGS. 4A and 4B, illustrates a semiconductor package having a plurality of dies mounted over a die paddle but at least one of the die is not connected to the die paddle, wherein FIG. 4A illustrates a cross-sectional view and FIG. 4B illustrates a top view;

FIG. 5, which includes FIGS. 5A and 5B, illustrates a semiconductor package having at least three dies mounted over a die paddle but at least one of the die is not connected to the die paddle, wherein FIG. 5A illustrates a cross-sectional view and FIG. 5B illustrates a top view;

FIG. 6, which includes FIGS. 6A and 6B, illustrates a semiconductor package having at least three dies mounted over a die paddle but at least one of the die is not connected to the die paddle, wherein FIG. 6A illustrates a cross-sectional view and FIG. 6B illustrates a top view;

FIG. 8, which includes FIGS. 8A and 8B, illustrates an alternative embodiment of the semiconductor package having galvanic interconnects, wherein FIG. 8A illustrates an embodiment in which the isolating dielectric layer 130 is disposed under the first die and wherein FIG. 8B illustrates an embodiment in which the isolating dielectric layer 130 is disposed on sidewalls of the first die; and FIG. 9, which includes

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Semiconductor packages comprising power semiconductor devices may comprise multiple dies packaged within. For example, a plurality of discrete power devices may be packaged along-side an integrated circuit chip, which may be used for controlling the discrete power devices. The dies including the power devices may be embedded within an encapsulating material, which provides protection and hermetic sealing while providing external connections through a lead frame or a substrate. In conventional packages, care has to be taken to separate and isolate the power devices from the integrated circuit chips, which increases both the packaging costs, performance, and/or size.

One way of packaging may involve the use of an insulating adhesive film in which the die is attached to a conducting substrate by the insulating adhesive film. However, such insulating adhesive films typically have many defects such as voids, which may grow due to a phenomenon called partial glow discharge. The gases contained within these voids may become ionized and may be accelerated by the electric field developed between the die and the substrate. If a large number of ions are created, these ions may cause an ion avalanche, which can expand the voids further by burning through the material in which the void exists. Over the lifetime of the device, the void growth may breakdown the insulating adhesive film. Further, other breakdown mechanisms may operate at high electric fields, especially slow processes that may be difficult to identify over typical accelerated field tests, which are performed over a short period of time.

Embodiments of the invention overcome these and other problems associated with power devices and may be applied to various semiconductor packages comprising multiple dies.

A structural embodiment of the invention will be described using FIG. 1. Further structural embodiments will be described using FIGS. 2-8. An embodiment of a method of fabricating the semiconductor package will be described using FIG. 9.

Figure 1A:
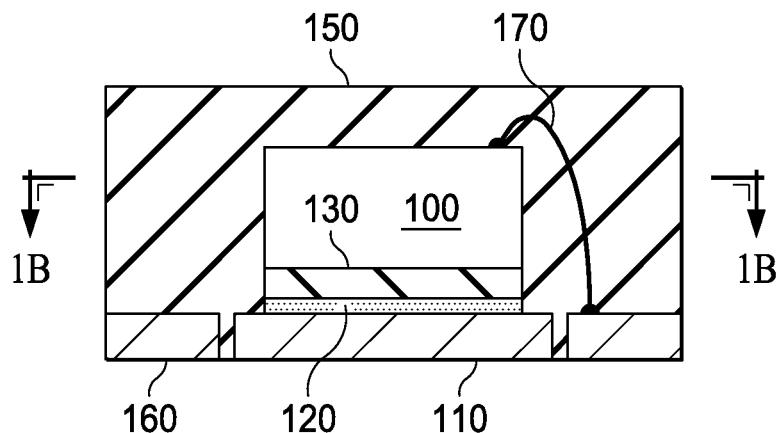
Figure 1B:
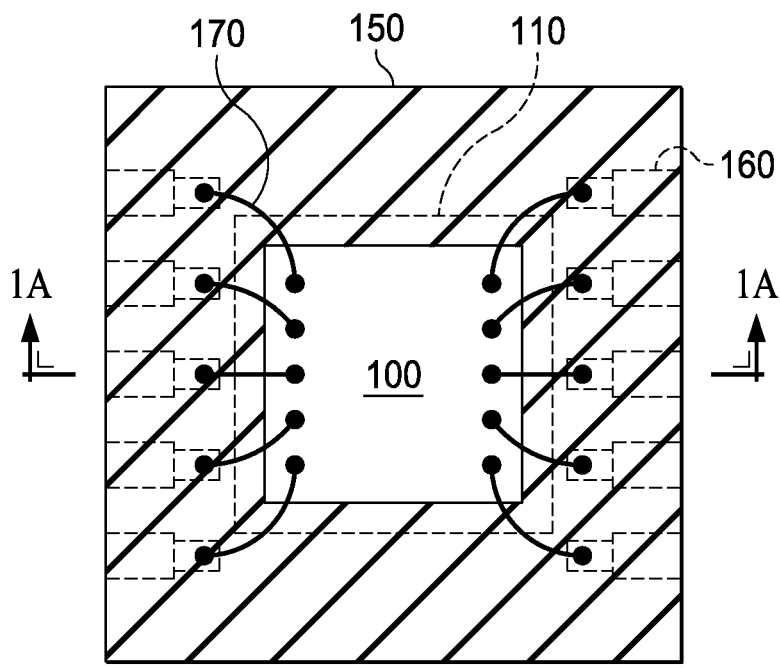

FIG. 1, which includes FIGS. 1A and 1B, illustrates a semiconductor package in accordance with an embodiment of the invention, wherein FIG. 1A illustrates a cross-sectional view and FIG. 1B illustrates a top view.

In various embodiments, the semiconductor package may be any suitable type of package such as a small-outline integrated circuit package, plastic (dual) small-outline package, thin small-outline package, shrink small-outline package, thin-shrink small-outline package, dual flat no-lead package, quad flat package, quad flat no-lead (QFN) surface mount package including a power QFN package.

Referring to FIG. 1A, a semiconductor package in accordance with various embodiments of the invention comprises a first die 100 disposed within an encapsulant 150 (encapsulating material). The encapsulant 150 comprises a dielectric material and may comprise a mold compound in one embodiment. In other embodiments, the encapsulant may comprise a polymer, a biopolymer, a fiber impregnated polymer (e.g., carbon or glass fibers in a resin), a particle filled polymer, and other organic materials. In one or more embodiments, the encapsulant 150 comprises a sealant not formed using a mold compound, and materials such as epoxy resins and/or silicones. In various embodiments, the encapsulant 150 may be made of any appropriate duroplastic, thermoplastic, or thermosetting material, or a laminate. The material of the encapsulant 150 may include filler materials in some embodiments. In one embodiment, the encapsulant 150 may comprise epoxy material and a fill material comprising small particles of glass or other electrically insulating mineral filler materials like alumina or organic fill materials.

In various embodiments, the first die 100 may comprise any type of die. In one embodiment, the first die 100 comprises a discrete semiconductor device while in another embodiment the first die 100 comprises an integrated circuit chip. In one embodiment, the first die 100 comprises a logic chip. In an alternative embodiment, the first die 100 includes a sensor. In various embodiments, the first die 100 has no contacts on the back side. Rather, the front side of the first die 100 has a plurality of contact pads.

The first die 100 is mounted over a die paddle 110 of a lead frame or other such substrates. The die paddle 110 may be coupled to a back plane, e.g., a current carrying conductor. The lead frame comprises a die paddle 110 or a die attach and a plurality of leads 160 in one embodiment as illustrated in FIG. 1B. The die paddle 110 may be larger foot print than the first die 100 as illustrated in FIG. 1B.

In various embodiments, the lead frame may be any type of package. In one or more embodiments, the lead frame may be a small outline (SO) package such as SuperSO, power SO-8 type of package, as well as other types of lead frame selected based on the package type.

Embodiments of the invention may mount the first die 100 over any other suitable carrier. A lead frame is shown only as an illustration. In other embodiments, a wired substrate, laminate, and others may be used.

As illustrated in FIG. 1A, the back side of the first die 100 is attached to the die paddle 110 through an adhesive layer 120. The adhesive layer 120 may be any suitable adhesive. In one embodiment, the adhesive layer 120 may be an electrically conductive adhesive layer. In other embodiments, the adhesive layer 120 may be an insulating adhesive, a soft solder or a nano die attach.

An isolating dielectric layer 130 is disposed under the first die 10. The isolating dielectric layer 130 is disposed between the first die 100 and the adhesive layer 120. Thus, the first die 100 is electrically isolated from the potential of the die paddle 110. For example, the first die 100 may have sensor devices that may be susceptible to electric, magnetic fields, or heat generated from the die paddle 110. For example, in or more embodiments, the die paddle 110 may be coupled to a voltage without coupling the first die 100 to that voltage.

Advantageously, the die paddle 110 may be coupled to a potential without coupling the first die 100. The thick isolating dielectric layer 130 isolates and protects the first die 100 from the potential on the die paddle 110. The die paddle 110 may be coupled to a high voltage node, e.g., greater than about 10V, or about 10V to about 30V. In some embodiments, the die paddle 110 may be coupled to a high voltage node such that the potential at the die paddle 110 is greater than about 5V, or about 10V to about 100V in one embodiment.

In some embodiments, the die paddle 110 may be coupled to a high voltage node such that the potential at the die paddle 110 is greater than about 10V, or about 100V to about 1 kV in another embodiment.

In various embodiments, the potential difference between the die paddle 110 and the back surface of the first die 100 during operation may be at least 10V, and about 10V to about 100V in various embodiments. In one embodiment, the potential difference between the die paddle 110 and the back surface of the first die 100 during operation may be about 20V to about 40V.

In various embodiments, the isolating dielectric layer 130 has a thickness of about 100 nm to about 10 μm. In one or more embodiments, the isolating dielectric layer 130 comprises a thickness of about 500 nm to about 5 μm. In one or more embodiments, the isolating dielectric layer 130 comprises a thickness of about 2 μm to about 5 μm. In one or more embodiments, the isolating dielectric layer 130 comprises a thickness greater than about 1 μm. In one or more embodiments, the isolating dielectric layer 130 comprises a thickness greater than about 5 μm. In one or more embodiments, the isolating dielectric layer 130 comprises a thickness greater than about 0.5 μm. In various embodiments, the thickness of the isolating dielectric layer 130 is much larger than conventional dielectric layers formed during interconnect metallization in semiconductor processing. In various embodiments, the isolating dielectric layer 130 comprises a silicon oxide or a silicon nitride. In other embodiments, the isolating dielectric layer 130 may comprise other types of nitrides or oxides.

In various embodiments, the material and thickness of the isolating dielectric layer 130 are chosen so that the dielectric breakdown is higher than at least 30 V i.e. the potential difference of 30 V between the first die 100 and the die paddle 110 does not cause dielectric breakdown. In another embodiment, the material and thickness of the isolating dielectric layer 130 are chosen so that the dielectric breakdown is higher than at least 60 V.

In yet another embodiment, the isolating dielectric layer 130 comprises a plurality of layers. In one embodiment, the isolating dielectric layer 130 comprises a combination of an oxide layer (e.g., silicon oxide) and a nitride layer (e.g., silicon nitride) including a plurality of oxide/nitride layers stacked over one another. The combinations of dielectric layers may be used to avoid stress based delamination and crack propagation in some embodiments.

In alternative embodiments, the isolating dielectric layer 130 may comprise other inorganic insulating materials, like zirconium (di)oxide, titanium (di)oxide or aluminum oxide.

The plurality of contacts on the front side of the first die 100 may be coupled to the lead frame through a variety of connections. In one embodiment, wire bonds 170 may be used to interconnect the first die 100 with the plurality of leads 160 on the leadframe.

Figure 2A:
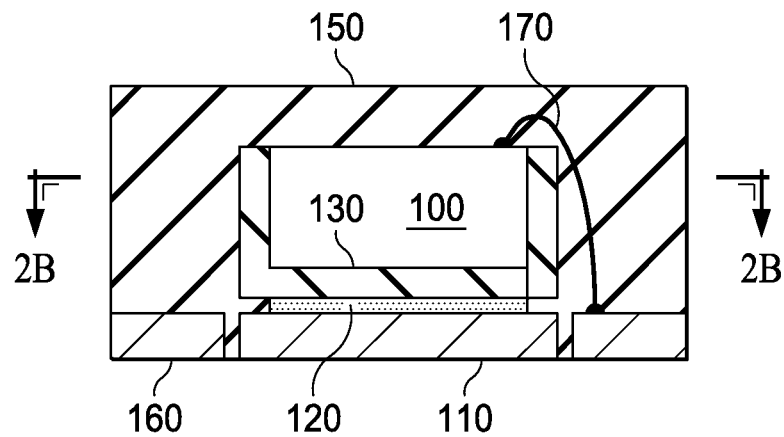
Figure 2B:
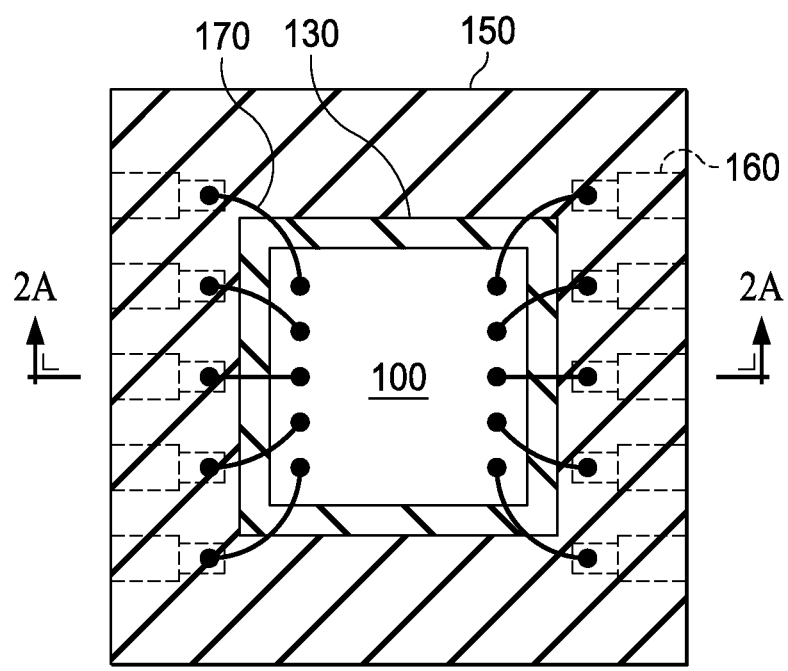

FIG. 2, which includes FIGS. 2A and 2B, illustrates an alternative embodiment of a semiconductor package wherein the isolating dielectric layer is formed on the sidewalls of the first die, wherein FIG. 2A illustrates a cross-sectional view and FIG. 2B illustrates a top view.

In this embodiment, an isolating dielectric layer 130 is disposed not only under the bottom surface of the first die 100 but also on sidewalls of the first die 100. Thus, the isolating dielectric layer 130 surrounds the first die 100 as illustrated in FIG. 2B.

The isolating dielectric layer 130 protects the sidewalls of the first die 100 from fields arising from the die paddle 110. For example, the interface between the encapsulant 150 and the first die 100 may be susceptible to delamination or cracks. The encapsulant 150 around the cracks may be susceptible to breakdown because of the potential difference between the first die 100 and the die paddle 110. However, advantageously, the presence of the isolating dielectric layer 130 avoids such problems because the susceptibility to breakdown of the isolating dielectric layer 130 is much higher than the encapsulant 150.

Figure 3A:
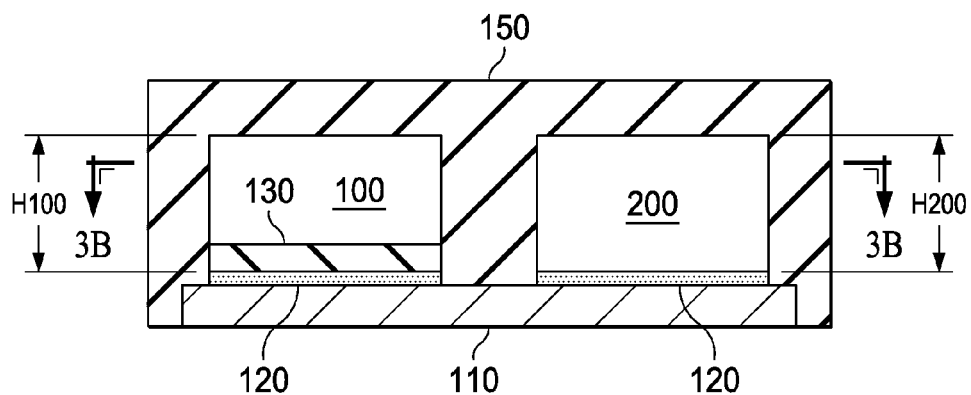
Figure 3B:
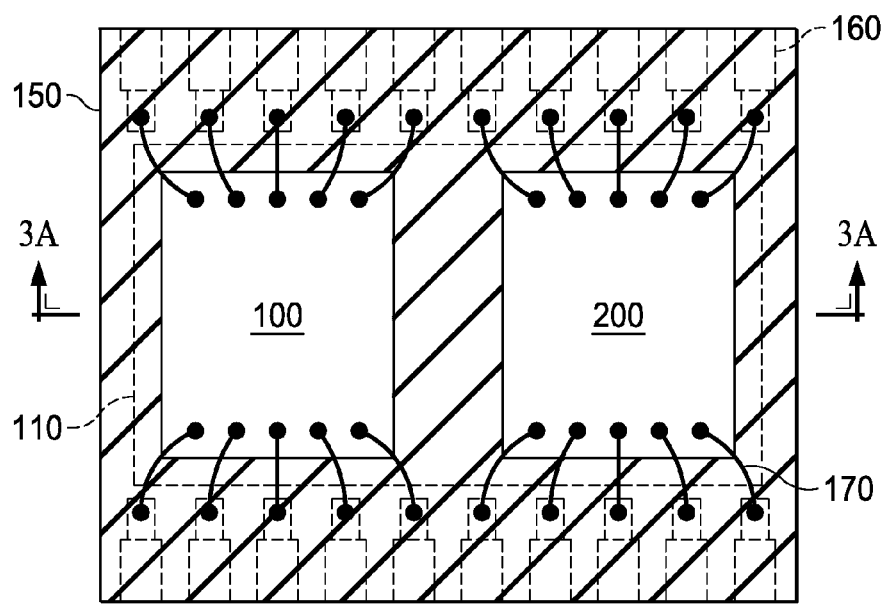

FIG. 3, which includes FIGS. 3A and 3B, illustrates a semiconductor package having a plurality of dies mounted over a die paddle but at least one of the die is not connected to the die paddle, wherein FIG. 3A illustrates a cross-sectional view and FIG. 3B illustrates a top view.

FIG. 3A illustrates a first die 100 and a second die 200 mounted over a die paddle 110. The first die 100 has a first height H100 while the second die 200 has a second height H200. The second height H200 might be larger than the first height H100 such that both dies have a common top surface. Alternatively, in another embodiment, the first height H100 may be about the same as the second height H200 so that the second die 200 remains under a thicker portion of the encapsulating 150 than the first die 100.

As illustrated in FIG. 3A, the first die 100 is insulated from the die paddle 110 while the back surface of the second die 200 is electrically coupled to the die paddle 110 through the second adhesive layer 220. The second die 200 is attached to the die paddle 110 using the second adhesive layer 220. In one or more embodiments, the second adhesive layer 220 is conductive, and therefore, the second die 200 is coupled to the die paddle 110 through the second adhesive layer 220.

In one embodiment, the second die 200 is a vertical device having both front side and back side contacts. In one embodiment, the second die 200 is a vertical transistor. In one embodiment, the second die 200 is a discrete vertical transistor. In a further embodiment, the second die 200 is a power transistor while the first die 100, in contrast, is a logic controller. The first and the second die 100 and 200 may form part of a power module in one embodiment. Thus, the high potential applied on the second die 200 has no impact on the first die 100, which is protected by the isolating dielectric layer 130.

Figure 4A:
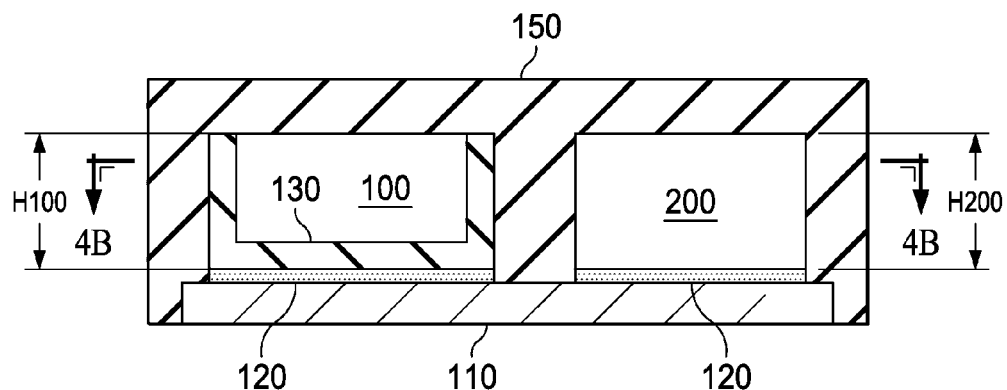
Figure 4B:
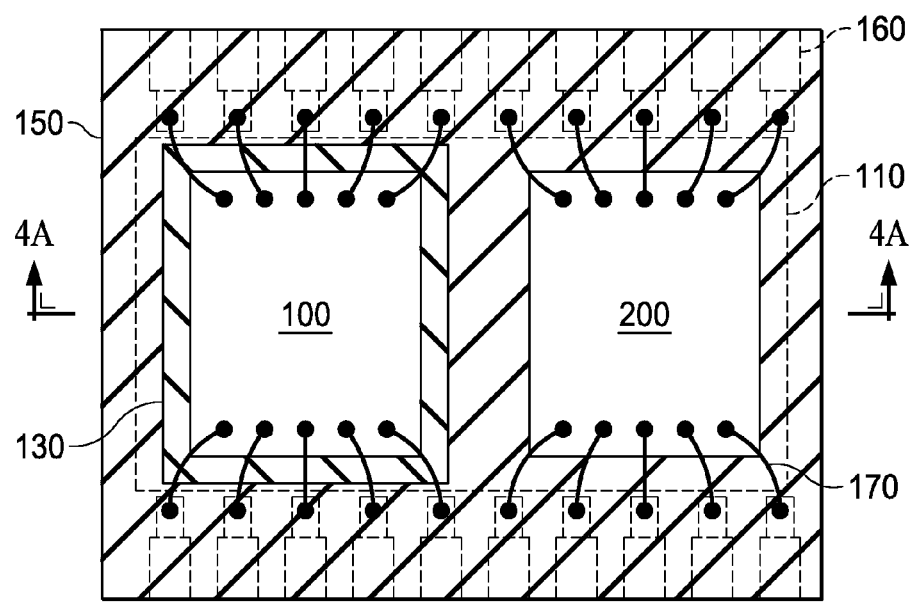

FIG. 4, which includes FIGS. 4A and 4B, illustrates a semiconductor package having a plurality of dies mounted over a common die paddle but at least one of the die is not connected to the die paddle, wherein FIG. 4A illustrates a cross-sectional view and FIG. 4B illustrates a top view.

Unlike the embodiment illustrated in FIG. 3, in this embodiment, the isolating dielectric layer 130 is formed around the sidewalls of the first die 100 as described with respect to FIG. 2. A layer of the isolating dielectric layer 130 separates the first die 100 from the second die 200. Thus, the first die 100 is protected and isolated not only from the die paddle 110 but also from the second die 200. Thus, lateral parasitic interference between the first die 100 and the second die 200 is mitigated.

Figure 5A:
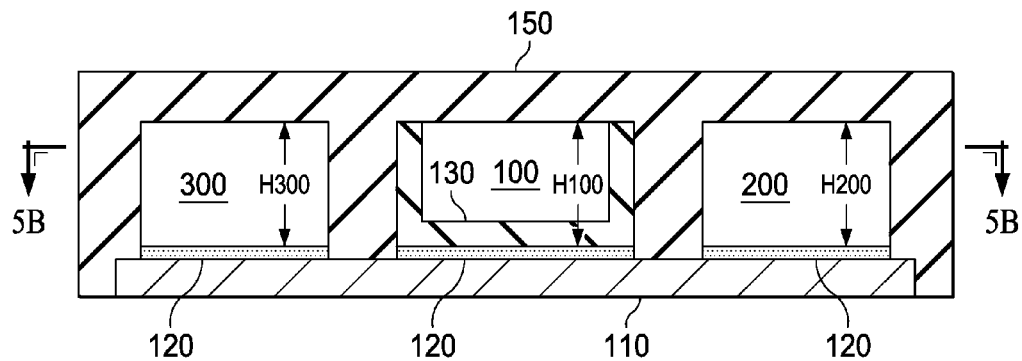
Figure 5B:
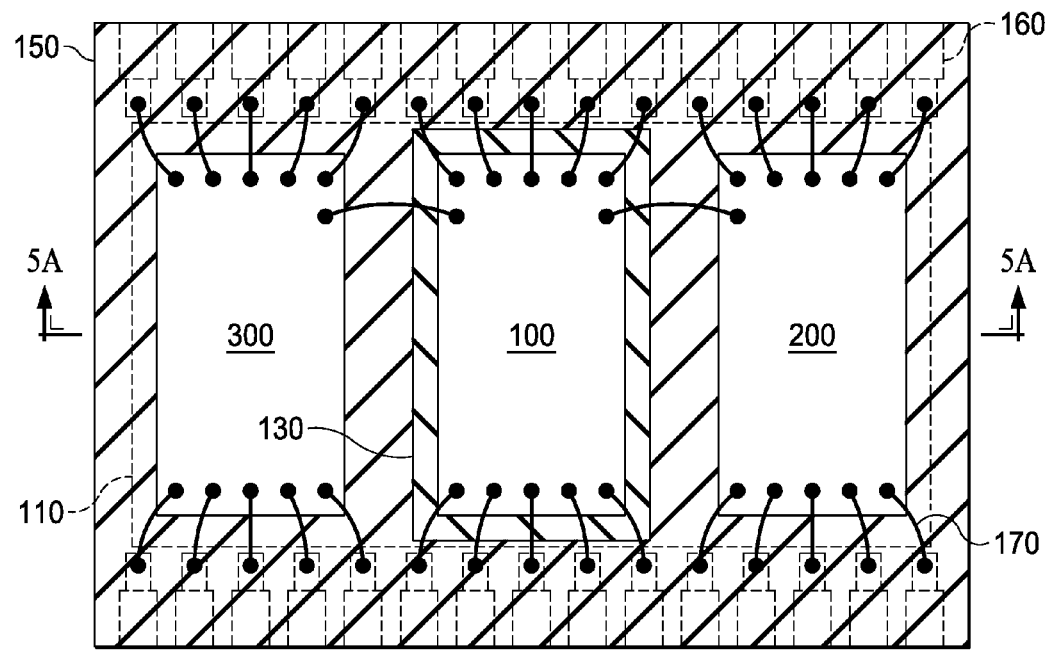

FIG. 5, which includes FIGS. 5A and 5B, illustrates a semiconductor package having a plurality of dies mounted over a die paddle but at least one of the die is not connected to the die paddle, wherein FIG. 5A illustrates a cross-sectional view and FIG. 5B illustrates a top view.

The plurality of dies mounted over the die paddle 110 may comprise more than two dies as illustrated in FIG. 5. As shown in FIG. 5A, a first die 100, a second die 200, and a third die 300 may be mounted over a die paddle 110. The first die 100 is disposed centrally around which the second die 200 and the third die 300 are placed. The back surface of second die 200 and the back surface of the third die 300 may be coupled through the die paddle 110.

The contact regions on the front surfaces of the first, the second, and the third dies 100, 200, and 300 may be coupled using interconnects. The interconnects may comprise different types of connections in various embodiments. In one embodiment, the interconnects may comprise wire bonds. In other embodiments, the interconnects may be metal sheets, strips, galvanic interconnects and others.

Figure 6A:
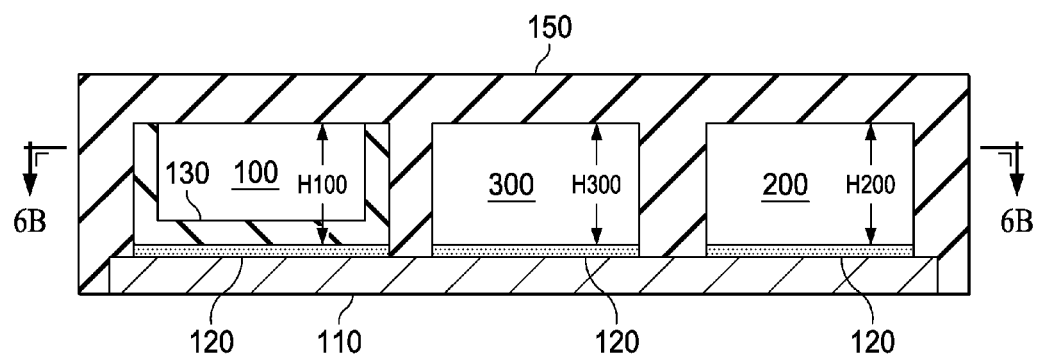
Figure 6B:
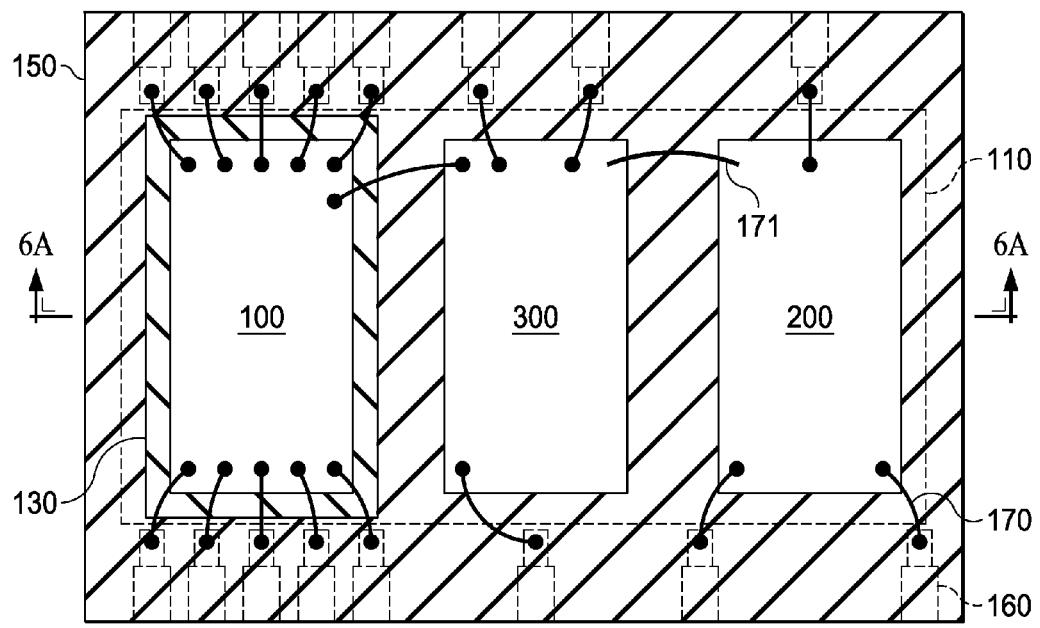

FIG. 6, which includes FIGS. 6A and 6B, illustrates a semiconductor package having a plurality of dies mounted over a die paddle but at least one of the die is not connected to the die paddle, wherein FIG. 6A illustrates a cross-sectional view and FIG. 6B illustrates a top view.

Unlike the embodiment described in FIG. 5, the second die 200 and the third die 300 are placed together while the first die 100 is placed in one corner. This is advantageous to minimize interference from the second die 200 or the third die 300 to the first die 100. The second die 200 and the third die 300 are coupled together through the back surface via the die paddle 110. Similarly, contacts on the front surfaces of the second and the third dies 200 and 300 may be coupled through power interconnects 171 (FIG. 6B), which may be thicker (heavy gauge) to support the higher current requirements between the second and the third dies 200 and 300, which may be power devices.

Figure 7:
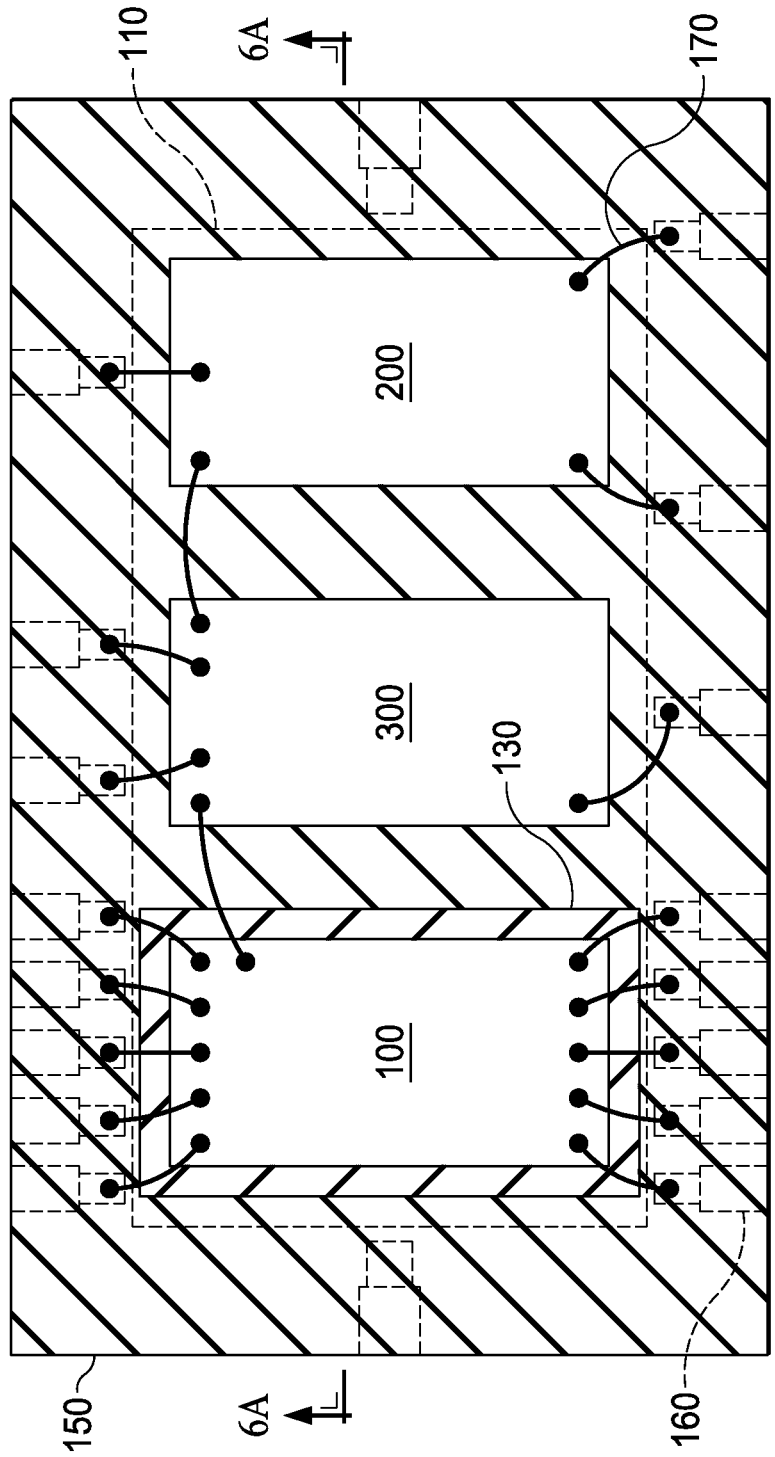
FIG. 7 illustrates a top view of a semiconductor package having at least three dies mounted over a die paddle but at least one of the die is not connected to the die paddle and in which at least some of the dies comprise power dies.

FIG. 7 illustrates a top view of a semiconductor package having a plurality of dies mounted over a die paddle but at least one of the die is not connected to the die paddle and in which at least some of the dies comprise power dies.

FIG. 7 illustrates an example in which the second die 200 and the third die 300 are discrete power transistors. Accordingly, the second die 200 and the third die 300 are coupled to few leads. In one embodiment, the back surface of the second die 200 comprising, for example, a drain of the second die 200 may be coupled to the back surface of the third die 300 comprising, for example, a source of the third die 300. Further, the package may comprise leads on all four directions as in a quad-in-line package, for example, the die paddle 110 may be coupled through a separate lead as illustrated in FIG. 7.

Figure 8A:
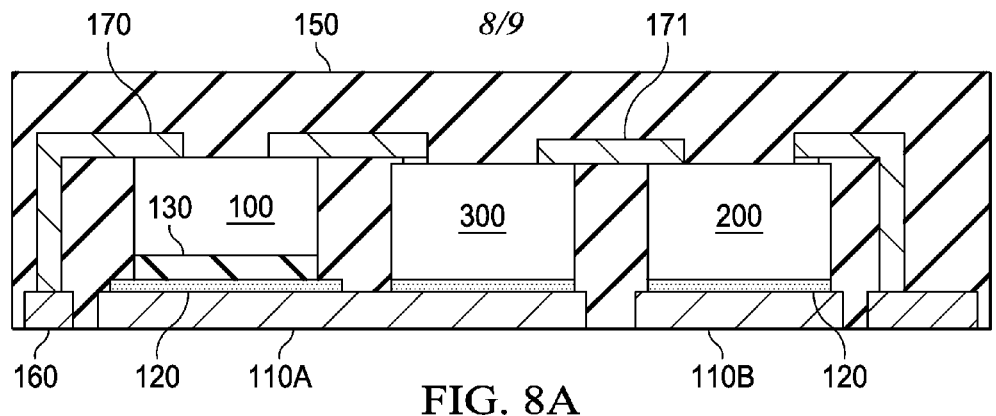
Figure 8B:
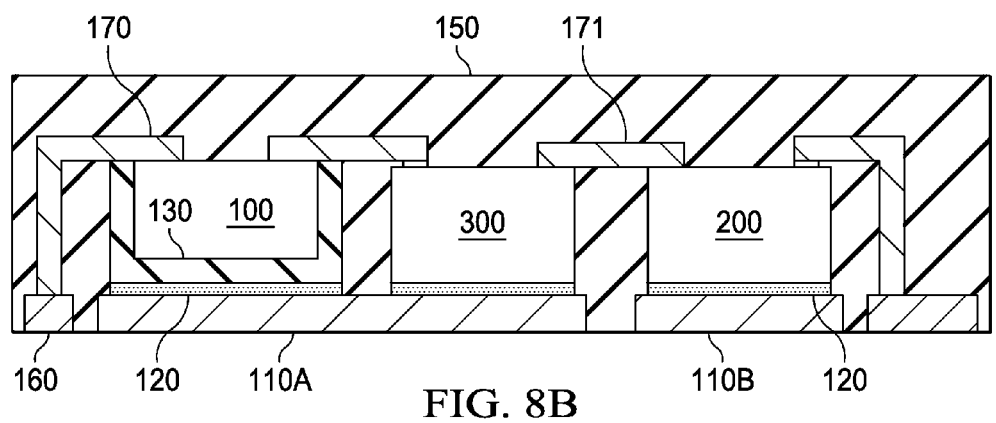

FIG. 8, which includes FIGS. 8A and 8B, illustrates an alternative embodiment of the semiconductor package having galvanic interconnects, wherein FIG. 8A illustrates an embodiment in which the isolating dielectric layer 130 is disposed under the first die and wherein FIG. 8B illustrates an embodiment in which the isolating dielectric layer 130 is disposed also on sidewalls of the first die.

Conventional interconnects formed using wire-bonding, ribbon-bonding and clip bonding result in relatively small cross-sectional area conduction paths, which may be undesirable for power devices. Embodiments of the invention overcome these limitations by the use of thicker galvanic interconnects i.e., interconnects formed using a galvanic or electroplating process.

As illustrated in FIGS. 8A and 8B, the first die 100 and the third die 300 are disposed over a first die paddle 110A while the second die 200 is disposed over a second die paddle 110B. The second die 200 and the third die 300 are coupled through planar strip shaped power interconnects 171 for carrying higher currents between power devices. In one or more embodiments, the power interconnects 171 may have a thickness of about 10 μm to about 50 μm. These thicker galvanic interconnects provide higher current carrying capacity than conventional wires.

In one embodiment, the second die 200 and the third die 300 comprise power devices such as discrete power transistor while the first die 100 comprises an integrated circuit chip.

Further details of methods of formation of the galvanic contacts are described in co-pending application, application Ser. No. 13/430,726, filed on Mar. 27, 2012, which is incorporated herein by reference. Embodiments of the present invention may be combined with the various embodiments in this application.

FIG. 9, which includes FIGS. 9A-9E, illustrates a semiconductor package during various stages of processing in accordance with embodiments of the invention.

Figure 9A:
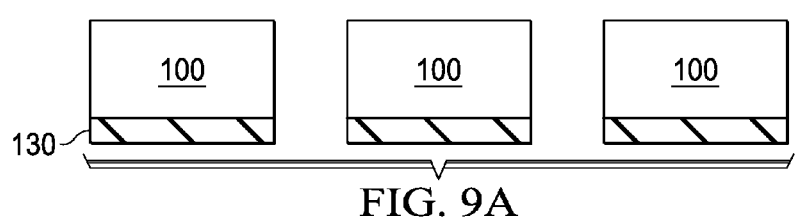
FIGS. 9A-9E, illustrates a semiconductor package during various stages of processing in accordance with embodiments of the invention.

Referring to FIG. 9A, first dies 100 are fabricated over a wafer using conventional processing. The first dies 100 are singulated and thinned to the first height H100. In one embodiment, the isolating dielectric layer 130 is deposited prior to singulation.

In various embodiments, the isolating dielectric layer 130 is deposited using a chemical vapor deposition (CVD) process. In various embodiments, the isolating dielectric layer 130 comprises a thickness of about 100 nm to about 10 μm.

Figure 9B:
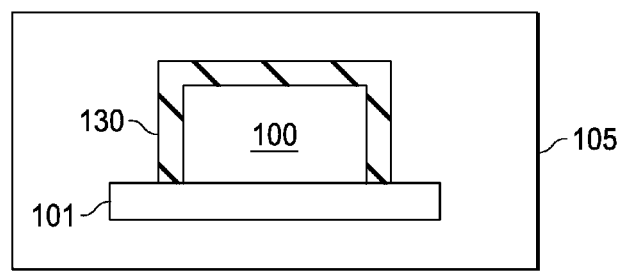

In an alternative embodiment illustrated in FIG. 9B, after singulation, the first die 100 is positioned and placed within a chamber 105 over a carrier 101. The front surface of the first die 100 having the contact areas is placed to face the carrier 101. Then, the exposed surfaces of the first die 100 are subjected to a deposition process such that an isolating dielectric layer 130 is deposited on the back surfaces and the sidewalls of the first die 100. The first die 100 may be removed from the carrier 101.

In one embodiment, after placing the carrier 101 with the first die 100 within the chamber 105, a precursor comprising the material to be deposited is pumped into the chamber 105. The precursor reacts on the surface of the first die 100 forming the isolating dielectric layer 130. In various embodiments, the CVD may be an atmospheric pressure CVD process, a low-INF pressure CVD, an ultrahigh vacuum CVD process, a plasma-enhanced (PE) CVD, a remote plasma-enhanced CVD, an atomic layer CVD process, metalorganic chemical vapor deposition.

In one embodiment, the isolating dielectric layer 130 comprises silicon oxide. The isolating dielectric layer 130 comprising oxide may be deposited using a precursor including silane and oxygen, silane and nitrous oxide, dichlorosilane ($SiCl_2H_2$) and nitrous oxide ($N_2O$), or tetraethylorthosilicate (TEOS) $Si(OC_2H_5)_4$) and water/heat. The isolating dielectric layer 130 comprising oxide may be deposited using low pressure CVD, atmospheric pressure CVD, or plasma enhanced CVD in various embodiments. In some embodiments, the isolating dielectric layer 130 comprising oxide may be deposited using a high-density plasma CVD process using silane and oxygen/argon precursors.

In one embodiment, silane with a flow rate of about 100 sccm to about 160 sccm, along with $N_2O$ of about 2000 sccm, at a total pressure of about 2.2 Torr to about 3.2 Torr, at a temperature of about 150° C., with RF power of about 220 W to about 320 W for about 60 s to about 90 s may be used to deposit a silicon oxide layer.

In an alternative embodiment, the isolating dielectric layer 130 comprises silicon nitride. The isolating dielectric layer 130 comprising nitride may be deposited using a precursor including silane and ammonia, dichlorosilane and ammonia, e.g., using a low pressure CVD, or using a precursor including silane and nitrogen, silane and ammonia, e.g., using a plasma enhanced CVD process.

In some embodiments, the processes may be cycled repeated depositing a thin layer of oxide followed by a thin layer of nitride, thereby forming a stack comprising oxide and nitride layers.

In other embodiments, suitable precursors may be selected for depositing other inorganic materials the isolating dielectric layer 130. Such precursors may include titanium chloride, zirconium tert-butoxylate or aluminium acetylacetonate or others.

Figure 9C:
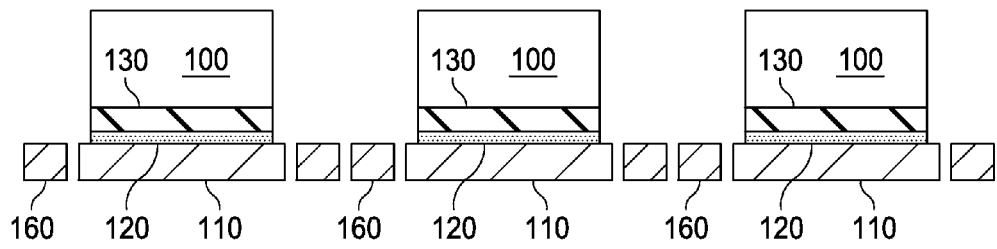

Referring to FIG. 9C, an adhesive layer 120 is applied to the exposed bottom surface of the isolating dielectric layer 130. In one embodiment, the adhesive layer 120 comprises a polymer such as a cyanide ester or epoxy material and may comprise silver particles. Alternatively, in another embodiment, the adhesive layer 120 comprises a solder such as lead-tin material. The adhesive layer 120 may be dispensed in controlled quantities under the dielectric layer 130. An adhesive layer 120 having a polymer may be cured at about 125° C. to about 200° C. while solder based adhesive layer 120 may be cured at 250° C. to about 350° C. Using the adhesive layer 120, the first die 100 is attached to a die paddle 110 of a lead frame having a plurality of leads 160.

Additional dies such as the second die 200 and the third die 300 described in prior embodiments (e.g. FIG. 7) may be also attached to the die paddle 110 or to separate die paddles as required by the package design.

The coverage and the material of the adhesive layer 120 determine the reliability and performance of the package. Voids and/or variations in thickness or coverage can result in reliability failures. For example, voids may reduce the adhesion strength between the first die 100 and the lead frame especially during temperature cycling.

Figure 9D:
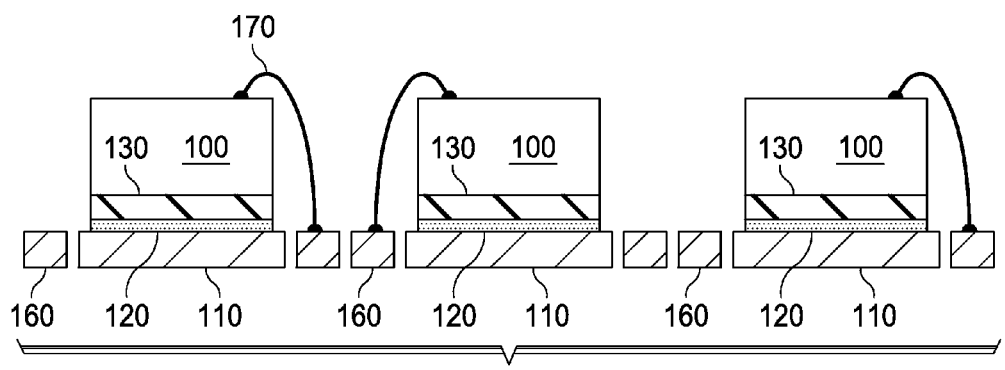

Referring to FIG. 9D, the contacts regions from the front side of the first die 100 are interconnected to the plurality of leads 160. In one embodiment, the interconnects comprise wire bonds 170. In other embodiments, the interconnects may comprise other types of connections such as galvanic strips or plates. In one embodiment, the interconnects may comprise thick wires, for example, comprising aluminum. In one case, the thickness of such aluminum wires may be about 10 µm to about 1000 µm. In another case the wires, for example comprising gold. In that case the thickness of such gold wires may be about 10 µm to about 100 µm.

In one or more embodiments, high-speed wire bond equipment may be used to minimize the time of forming the interconnections. Image recognition systems may be used to orient the first dies 100 during the interconnecting in some embodiments.

In various embodiments, ball bonding or wedge bonding may be used to form the interconnects. In various embodiments, the interconnections e.g., comprising wire bonds 170 may be formed using thermosonic bonding, ultrasonic bonding, or thermo-compression bonding. Thermosonic bonding utilizes temperature, ultrasonic, and low impact force, and ball/wedge methods. Ultrasonic bonding utilizes ultrasonic and low impact force, and the wedge method only. Thermo-compression bonding utilizes temperature and high impact force, and the wedge method only.

For example, in one case, thermosonic bonding may be used with gold and copper wires. Two wire bonds are formed for each interconnection, one at contact regions of the first die 100 and another at a lead of the plurality of the leads 160 of the lead frame. Bonding temperature, ultrasonic energy, and bond force and time may have to be closely controlled to form a reliable connection from the first die 100 to the lead frame.

In an alternative embodiment, the interconnects may be formed using a galvanic process (electro chemical deposition).

The interconnects may be different between the first die and the lead frame and between the dies especially between power dies in some embodiments.

Figure 9E:
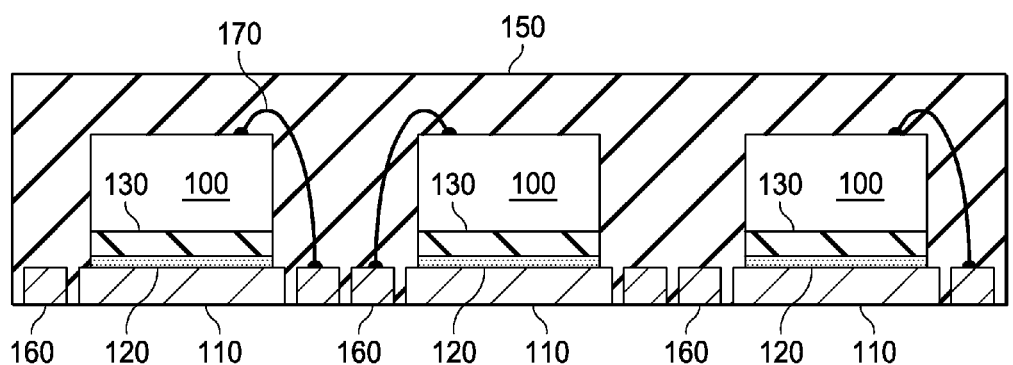

Referring to FIG. 9E, the lead frame and the first die 100 are covered with an encapsulating material, i.e., encapsulant 150. In one embodiment, the encapsulating material comprises a mold compound. In other embodiments, other materials may be used as the encapsulating material. The encapsulating material may be applied using compression molding, injection molding, granulate molding, powder molding, or liquid molding in case of a mold compound. If necessary, curing process may be performed after applying the encapsulating material.

Thus, after forming the encapsulant 150, an artificial substrate comprising a plurality of semiconductor packages is formed. This artificial substrate may be singulated, e.g., mechanically to form individual packages.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. As an illustration, the embodiments described in FIG. 1 may be combined with the embodiments described in FIG. 2-8. It is therefore intended that the appended claims encompass any such modifications or embodiments.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor package comprising:
    a first die embedded within an encapsulant and disposed over a substrate coupled to a high voltage node of at least 10 V;
    a dielectric liner layer disposed under the first die and between the first die and the substrate, wherein the dielectric liner layer completely covers a bottom surface of the first die, and wherein the dielectric liner electrically isolates the first die from the substrate without electrically coupling the first die to the high voltage node; and a bond layer disposed between the substrate and the dielectric liner layer.

2. The semiconductor package of claim 1, wherein the dielectric liner layer is disposed around sidewalls of the first die.

3. The semiconductor package of claim 1, wherein the dielectric liner layer under the first die is in contact with the bond layer.

4. The semiconductor package of claim 1, wherein the bond layer comprises an insulating adhesive, a conductive adhesive, a soft solder or a nano die attach.

5. The semiconductor package of claim 1, wherein the dielectric liner layer comprises a thickness of about 100 nm to about 10 µm.

6. A semiconductor package comprising:
a first die embedded within an encapsulant and disposed over a substrate coupled to a high voltage node;
a dielectric liner layer disposed under the first die and between the first die and the substrate, wherein the dielectric liner layer is disposed around sidewalls of the first die, wherein the dielectric liner electrically isolates the first die from the substrate without electrically coupling the first die to the high voltage node; and
a second die embedded within the encapsulant and disposed over the substrate, wherein the second die is electrically coupled to the substrate, wherein the first die and the second die are coupled to a same surface of the substrate.

7. The semiconductor package of claim 6, further comprising a bond layer disposed over the substrate, wherein the dielectric liner layer under the first die is in contact with the bond layer.

8. The semiconductor package of claim 7, wherein the bond layer comprises an insulating adhesive, a conductive adhesive, a soft solder or a nano die attach.

9. The semiconductor package of claim 6, wherein the dielectric liner layer comprises silicon oxide.

10. The semiconductor package of claim 6, wherein the dielectric liner layer comprises silicon nitride.

11. The semiconductor package of claim 6, wherein the dielectric liner layer comprises a thickness of about 100 nm to about 10 µm.

12. The semiconductor package of claim 6, wherein the dielectric liner layer comprises a thickness of about 500 nm to about 5 µm.

13. The semiconductor package of claim 6, wherein the substrate comprises a lead frame, the lead frame comprising a die paddle and a plurality of leads, and wherein the first die is electrically isolated from the die paddle.

14. The semiconductor package of claim 13, further comprising a plurality of interconnects coupling the plurality of leads with contact regions on a top side of the first die, wherein the dielectric liner layer covers an opposite bottom side of the first die.

15. The semiconductor package of claim 13, wherein the first die is a logic controller, and wherein the second die is a discrete vertical transistor.

16. The semiconductor package of claim 13, further comprising an adhesive layer disposed between the dielectric liner layer and the die paddle, the adhesive layer contacting the dielectric liner layer and the die paddle.

17. A semiconductor package comprising:
a lead frame comprising a die paddle and a plurality of leads;
a first die embedded within an encapsulant and disposed over the die paddle, the first die being electrically isolated from the die paddle;
a second die embedded within the encapsulant and disposed over the die paddle, the second die being electrically coupled to the die paddle; and
a dielectric liner layer disposed under the first die and the die paddle, wherein the first die is electrically isolated from the die paddle by the dielectric liner, wherein the dielectric liner layer comprises a thickness of about 100 nm to about 10 µm.

18. The semiconductor package of claim 17, wherein the dielectric liner layer is disposed on sidewalls of the first die.

19. The semiconductor package of claim 18, wherein the dielectric liner layer comprises silicon oxide.

20. The semiconductor package of claim 18, wherein the dielectric liner layer comprises silicon nitride.

21. The semiconductor package of claim 18, wherein the dielectric liner layer comprises a thickness of about 500 nm to about 5 µm.

22. The semiconductor package of claim 18, wherein the dielectric liner layer comprises a chemical vapor deposited layer.

23. The semiconductor package of claim 18, further comprising:
a first adhesive layer disposed between the dielectric liner layer and the die paddle, the first adhesive layer contacting the dielectric liner layer and the die paddle; and
a second adhesive layer between the second die and the die paddle.

24. The semiconductor package of claim 23, wherein the first and the second adhesive layers are electrically conductive.

25. A method of fabricating a semiconductor package, the method comprising:
providing a first die, the first die having contact regions on a top surface but not on an opposite bottom surface;
depositing a dielectric liner layer under the bottom surface of the first die, the dielectric liner layer completely covering the bottom surface of the dielectric liner layer; and
attaching the first die with the deposited dielectric liner layer to a substrate configured to be coupled to a high voltage node of at least 10 V, wherein the dielectric liner electrically isolates the first die from the substrate.

26. The method of claim 25, wherein the dielectric liner layer comprises a thickness of about 100 nm to about 10 µm.

27. The method of claim 25, wherein depositing the dielectric liner layer further comprises depositing on sidewalls of the first die.

28. The method of claim 25, wherein depositing the dielectric liner layer comprises using a chemical vapor deposition process.

29. The method of claim 25, wherein the substrate comprises a lead frame comprising a die paddle, wherein the first die is attached to the die paddle.

30. The method of claim 29, further comprising:
interconnecting the contact regions on the top surface of the first die with leads on the lead frame; and
encapsulating the first die within an encapsulant.

31. The method of claim 30, wherein interconnecting the contact regions on the top surface of the first die comprises forming wire bonds.

32. The method of claim 30, wherein interconnecting the contact regions on the top surface of the first die comprises forming strip interconnects.

33. The method of claim 32, wherein the strip interconnects are formed using a galvanic deposition process.

34. The method of claim 29, further comprising:
providing a second die, the second die having a first contact region on a top surface and a second contact region on an opposite bottom surface; and
coupling the second contact region with the die paddle by attaching the second die to the die paddle.

35. The method of claim 34, wherein attaching the second die to the die paddle comprises attaching the second contact region to the die paddle using a conductive adhesive.

36. The method of claim 34, further comprising:
after attaching the first and the second dies, interconnecting the contact regions on the top surface of the first die and the first contact region on the top surface of the second die with leads on the lead frame; and
encapsulating the first die and the second die within an encapsulant.

37. A method of fabricating a semiconductor package, the method comprising:
providing a first substrate with a plurality of first dies;
singulating the first substrate into the plurality of first dies, the plurality of first dies having contact regions on a top surface;
after singulating, depositing a dielectric liner layer under a bottom surface of a first die of the plurality of first dies, the bottom surface having no contact regions;
attaching the first die with the deposited dielectric liner layer to a major surface of a die paddle of a lead frame, wherein the first die is electrically isolated from the die paddle by the deposited dielectric liner layer;
providing a second substrate with a plurality of second dies;
singulating the second substrate into the plurality of second dies, the plurality of second dies having contact regions on a top surface and an opposite bottom surface; and
attaching a second die of the plurality of second dies to the major surface of the die paddle of the lead frame, wherein the second die is electrically coupled to the die paddle.

38. The method of claim 37, wherein attaching the first die comprises
applying an adhesive material on a surface of the dielectric liner layer; and
placing the adhesive material on a die paddle of the lead frame.

39. The method of claim 37, wherein depositing the dielectric liner layer comprises using a chemical vapor deposition process.

40. The method of claim 37, wherein the dielectric liner layer comprises a thickness of about 100 nm to about 10 µm.

41. The method of claim 37, wherein depositing the dielectric liner layer further comprises depositing on sidewalls of the first die.

42. The method of claim 37, further comprising:
interconnecting the first die with leads on the lead frame; and
encapsulating the first die within an encapsulant.

43. The method of claim 37, wherein interconnecting the first die with leads on the lead frame comprises forming wire bonds.

44. The method of claim 37, wherein interconnecting the first die with leads on the lead frame comprises forming strip interconnects.

45. The method of claim 44, wherein the strip interconnects are formed using a galvanic deposition process.

46. The method of claim 37, further comprising cutting the lead frame to form individual packages.

\* \* \* \* \*